United States Patent [19]

Formigoni et al.

[11] Patent Number: 4,795,657

[45] Date of Patent: Jan. 3, 1989

[54] METHOD OF FABRICATING A PROGRAMMABLE ARRAY

[75] Inventors: Napoleon P. Formigoni, Birmingham; Zvi Yaniv, Southfield, both of Mich.

[73] Assignee: Energy Conversion Devices, Inc., Troy, Mich.

[21] Appl. No.: 721,108

[22] Filed: Apr. 8, 1985

Related U.S. Application Data

[63] Continuation-in-part of Ser. No. 600,304, Apr. 13, 1984, abandoned.

[51] Int. Cl.[4] .................. B05D 5/12; G11C 17/00; G11C 11/00
[52] U.S. Cl. ................................. 427/96; 365/100; 365/163
[58] Field of Search ............... 427/96; 365/100, 163

[56] References Cited

U.S. PATENT DOCUMENTS

| | | | |
|---|---|---|---|
| 3,271,591 | 9/1966 | Ovshinsky | 365/163 |
| 3,530,441 | 9/1970 | Ovshinsky | 365/113 |
| 3,629,863 | 12/1971 | Neale | 365/163 |
| 3,699,543 | 10/1972 | Neale | 365/163 |
| 3,827,033 | 7/1974 | Quilliam | 365/163 |
| 4,203,123 | 5/1980 | Shanks | 357/2 |
| 4,226,878 | 10/1980 | Ovshinsky et al. | 357/2 |

OTHER PUBLICATIONS

David et al "IEEE Trans. on Computers", vol. C-17, No. 8, Aug. 1968, pp. 721-728.

*Primary Examiner*—Shrive Beck
*Assistant Examiner*—Marianne L. Padget
*Attorney, Agent, or Firm*—Marvin S. Siskind; Richard M. Goldman; Kenneth M. Massaroni

[57] ABSTRACT

There is disclosed a thin film photoprogrammable memory array with a substantially increased resistance associated with each cell of the array. First and second sets of orthogonally oriented address lines are formed on a substrate with the first set of address lines crossing the second set of address lines at insulated cross-overs. A plurality of amorphous silicon diodes are deposited on the members of the first set of address lines adjacent the insulated cross over points. Settable memory material, an optically programmable chalcogenide, is deposited in electrical contact with each of the amorphous silicon diodes and in electrical contact with a member of the second set of address lines adjacent the cross-over region. When the settable memory material has been set to its high conductivity state, the electrical resistance between the amorphous silicon diode and the adjacent member of the second set of address lines is proportional to an effective electrical length measured along the settable storage member. A method of making the improved array is also disclosed. In a preferred embodiment the array is made on a flexible substrate made of a synthetic polymeric resin.

5 Claims, 8 Drawing Sheets

METHOD OF FABRICATING A PROGRAMMABLE ARRAY

RELATED APPLICATION

This application is a continuation-in-part of copending U.S. patent application, Ser. No. 600,304 entitled "Programmable Array", filed on April 13, 1984 by Napoleon Paul Formigoni, and abandoned on April 7, 1987.

BACKGROUND OF THE INVENTION

Programmable storage arrays adapted to store binary information for subsequent readout are known from the prior art. The prior art arrays such as shown in U.S. Pat. No. 3,699,543 to Neale which issued October 17, 1972 have included X and Y sets of address lines insulated from one another and oriented to be orthogonal to one another so as to form a plurality of cross-over points where the address lines cross one another. It has also been known from the prior art at each of the cross-over points to form an electrical isolation element such as a diode, in series with a settable storage element. This series combination is then connected between the corresponding X address line and the corresponding Y address line to form the addressable memory cell.

Such arrays are also referred to in U.S. Pat. No. 4,203,123 to Shanks which issued May 30, 1980. Shanks refers to forming the isolation diodes from amorphous silicon materials. Such diodes are disclosed in U.S. Pat. No. 4,226,898 to Ovshinsky which issued October 7, 1980. The '898 patent discloses both PN junction diodes and PIN type diodes.

Further it has been known from the prior art as in Shanks to use as the memory elements amorphous chalcogenide materials which can be set or reset so as to have a high or a low conductivity. In the prior art as shown in Shanks it has been known to form the amorphous silicon diodes physically above or below the chalcogenide based memory element. Neale has disclosed off-setting the diodes with respect to the settable memory elements.

In addition to being able to fabricate a usable array it's necessary to set selected storage locations to a condition corresponding a 1 or a 0, either during or after the fabrication process. When a read only memory is to be provided the programming can take place during the manufacturing process. In the case of reprogrammable memory arrays the programming may take place once the array has been fabricated.

Some of the problems associated with the prior art derive from the vertical arrangement of the isolation diode and memory cell assembly at the cross-over areas. In this configuration the resistance of the cell in series with the isolation diode is directly proportional to the thickness of the chalcogenide material. Therefore a low thickness of the chalcogenide film could result in an inadequately low value of the cell's "off" resistance.

A second serious problem is the deleterious influence of dust grains that could create a high concentration of point defects. When the film cell is sandwiched between two conductors grains of dust can create electrical shorts shunting the cell's impedance. The third serious problem is associated with the use of a transparent conductive electrode fabricated over the memory film to make it possible to optically program the array. The fabrication process of this transparent electrode involves heat treatments often harmful to the properties of the memory film. Moreover the sheet resistivity of the conductive transparent electrode is expected to be one order of magnitude larger than an ordinary metal electrode. This higher sheet resistance can have an adverse effect on the impedance of the address lines.

In the past the vast majority of integrated circuits have been formed on crystalline substrates which are usually quite rigid and brittle, requiring that such substrates be mounted on relatively thick, flat surfaces in order not to be broken. There are, however, applications in which it would be desirable to have integrated circuits which could be mounted on flexible surfaces, such as the surfaces of letters, packages or other objects which are not flat. The advantage of forming circuits upon such flexible substrates grows as does the size of the circuits involved, since large crystalline integrated circuits are even more subject to breakage than are small ones.

There has been some use of flexible substrates as surfaces on which to form circuit elements. For example, flexible substrates have been formed of synthetic polymeric resins, such as the high temperature polyimide sold under the trademark "Kapton" by the Dupont Company, Polymeric Products Department, Industrial Films Division, Wilmington, Del. 19898. When used as an electronic substrate, Kapton can withstand temperatures of up to 300° centigrade and the material has been used widely as a flexible substrate upon which metal lines are formed by photolithographic techniques and then upon which integrated circuits are mounted by soldering.

SUMMARY OF THE INVENTION

The present invention relates to a memory device comprising two address lines and a settable storage element. The storage element is connected in electrical series between the two address lines. It is made of a material which can be set from a first state which has one electrical conductivity to second state which has a very different conductivity. The memory device is designed so that the length of the electrical path through the settable storage element is substantially greater than the element's thickness. This causes the programmably variable resistance provided by the storage element to be much greater than if the electrical path through the element were in the direction of its thickness making the state of the memory element easier to electronically or optically read.

In a preferred embodiment of the invention, X and Y address lines, orthogonally oriented with respect to one another, are deposited on a first side of a substrate. At the cross-over points the address lines are insulated from one another. Isolation elements, such as diodes formed of deposited amorphous silicon film, can be placed adjacent each crossover point in electrical contact with members of one of the sets of address lines. Settable storage elements are formed between each of the isolation elements and a member of the other set of address lines. The resistance in series with each of the isolation elements is determined by the length of the settable storage element through which current flows.

A method of practicing the invention includes the steps of forming first and second sets of orthogonally oriented address lines, each set being insulated from other at cross-over points; forming a plurality of isolation elements in electrical contact with members of one set of address lines adjacent selected crossover points;

and forming settable storage elements adjacent at least some of the cross-over points, thereby electrically connecting a corresponding isolation element to a corresponding member of the second set of address lines.

In alternate embodiments of the invention the isolation element associated with each intersection between X and Y address lines is a rectifier, such as a p-n diode, a p-i-n diode, or a Schottky diode, and the settable element is a length of settable film which extends between electrical connections to its associated X and Y address lines. Preferably the rectifying element and the length of settable film are formed directly over one of their two associated address lines, so as to economize surface area. For example, in one embodiment the rectifier is a p-i-n diode formed of horizontal deposited layers of amorphous semiconductor material deposited upon a bottom address line. A layer of metal is placed over the top of this diode. An insulating layer is deposited over the bottom address line, the diode, and its top metal layer. A crossing top address line is placed over the insulating layer and a via is etched in the insulating layer. A length of settable film extends from an electrical contact with the top address line, through the via, to an electrical contact with the diode's top metal layer, and, through the diode, to the bottom address line.

Preferably the settable storage elements of the invention are formed of a film of deposited phase-changeable material. Such materials can be changed from a first phase, in which they have one conductivity, to a second phase, in which they have a second conductivity. In preferred embodiments, such phase changes are induced by the incidence of radient energy. In some embodiments the phase-changeable material, once set to its second phase, is substantially non-resettable to its first phase. However, in other embodiments, the phase-change material used is resettable. Both resettable and non-resettable chalcogenide materials can be formed from amorphous semiconductor materials, such as amorphous chalcogenide alloys.

In many embodiments the invention comprises an array of memory elements formed as an integrated circuit upon a common substrate. In some such embodiments the integrated circuit includes address decoding means formed out of X and Y address lines and diodes similar to those used in the integrated circuit's memory devices.

According to another embodiment of the invention, an integrated circuit is formed on a flexible substrate made of a synthetic polymeric resin such as a high temperature polyimide. Such a circuit can have an adhesive placed on its back so that is can be stuck to the surface of other objects, enabling it to be used as an electronic label, such as one containing information about the object to which it has been attached.

Other and further aspects of the invention set forth in the Detailed Description of the Preferred Embodiments and the claims which follow.

DETAILED DESCRIPTION OF THE PREFERRED EMBODIMENTS

Figure 1:
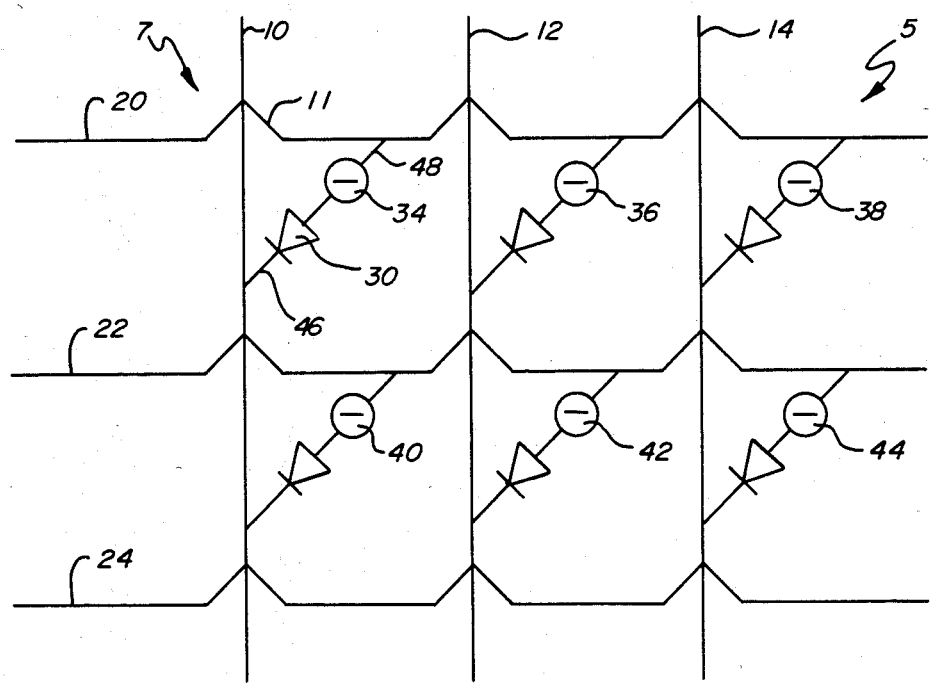
FIG. 1 is a sechematic of a portion of a memory array.

With respect to the figures, FIG. 1 discloses a schematic diagram of a memory matrix 5 having a plurality of addressable settable storage cells formed thereon. A plurality of X address lines 10, 12 and 14 along with a plurality of Y address lines 20, 22 and 24. It will be understood that while only a 3×3 matrix is shown in FIG. 1 the principles of the embodiment of the invention disclosed herein apply equally well to a matrix of any size. The X address lines 10, 12 and 14 are insulated from the Y address lines 20, 22 and 24 in FIG. 1. Adjacent to and near each cross-over point or region such as 11 of an X lines such as 10 and a Y line such as 20 is located an isolation element such as a diode 30 in series with a settable memory or storage element 34. The diode 30 may be a Schottky diode, a p-n diode or a p-i-n diode. One end 46 of the diode 30 is connected to an address line such as the X address line 10 and a connection 48 is also made between the memory element 34 and the Y address line 20. The memory element 34, as discussed subsequently, is formed of a deposited optically programmable chalcogenide material. The remaining memory elements 36-44 are identical to the element 34. Thus, each settable storage cell, such as a cell 7 includes at least a part of an X address line such as the line 10, a part of a Y address line such as the line 20, a storage element such as the element 34 and an isolation element such as the diode 30.

Figure 2:
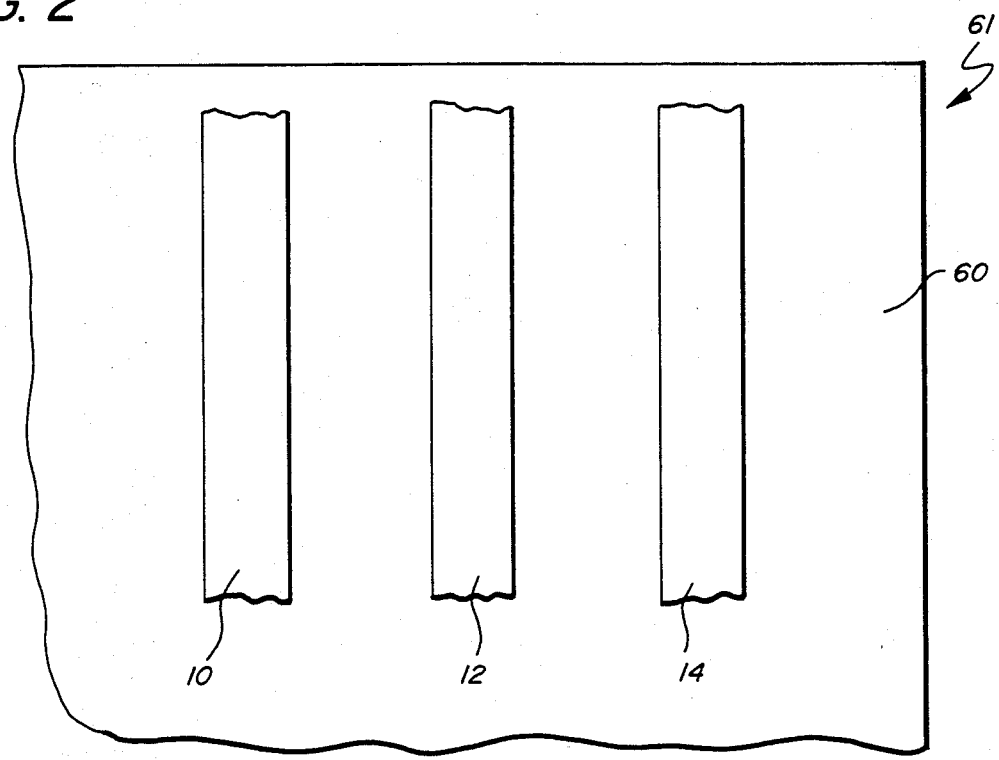
FIG. 2 is a planar top view of a portion of a substrate with a first set of address lines.

FIG. 2 shows a first step in fabricating an embodiment of the present invention. A substrate 60 which may be a sheet of stainless steel, continuous or otherwise, which has formed thereon an insulating glass film. Alternately instead of a stainless steel sheet or other type of metallic sheet, the substrate 60 may be any other insulating material such as glass of appropriate size, shape and strength. A set of X address lines corresponding to the lines 10 through 14 is first formed on the substrate 60. The X address lines each are formed with a width of 10 microns and spaced 15 microns apart. The center to center distances between a pair of address lines 10, 12 is 25 microns. A spray and lift off type process as is well know in the art is used to fabricate the address lines 10 through 14. A layer of positive photoresist is applied to the substrate 60, that layer of positive photoresist is exposed using a mask and developed. The exposed portion of the photoresist is removed. Tantalum is then sputter deposited onto the substrate 60 to form a layer thereon with a thickness of 2,000 angstroms plus or minus 10%. When the sputter depositing is completed, the excess material is removed from the substrate 60 as is well known in the art. The material that remains corresponds to the X address lines 10, 12 or 14.

Figure 3:
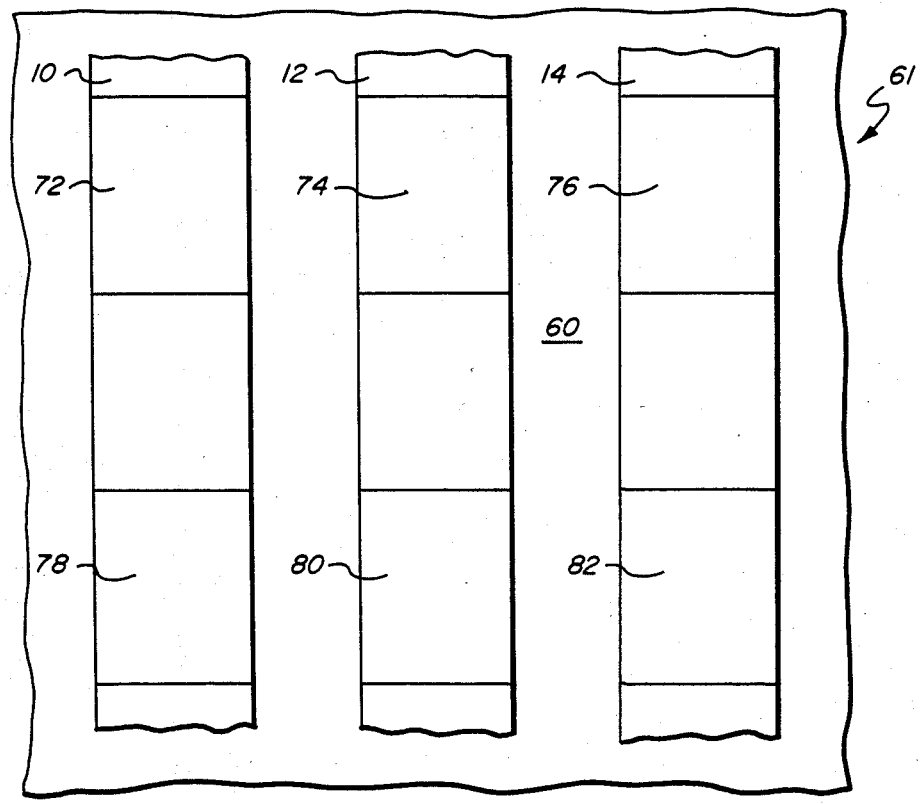
FIG. 3 is a planar top view of a portion of a substrate with oxidized regions formed on the first set of address lines.

In the next step as shown in FIG. 3 a plurality of regions 72 through 82 are oxidized so as to form a tantalum oxide insulating layer ($Ta_2O_5$) in those selected regions. Each such region 72 through 82 is 15 microns long and spaced 10 microns apart from the adjacent region on the same X address line. The oxide layer should have a thickness on the order of 1,000 angstroms which will result in a breakdown voltage which should exceed 60 volts.

To form the regions 72 through 82 positive photoresist is applied to the substrate and X address lines 20 through 14. Using a mask the regions 72 through 82 are exposed to light and then the photoresist is developed. The exposed photoresist is then removed. The regions 72 through 82 are then anodically oxidized.

The oxidized regions 72 through 82 are then coated with a layer of manganese dioxide ($MnO_2$). The layer of manganese dioxide is applied to the entire substrate 60 but coats only the regions 72 through 82 due to the photoresist.

Figure 4:
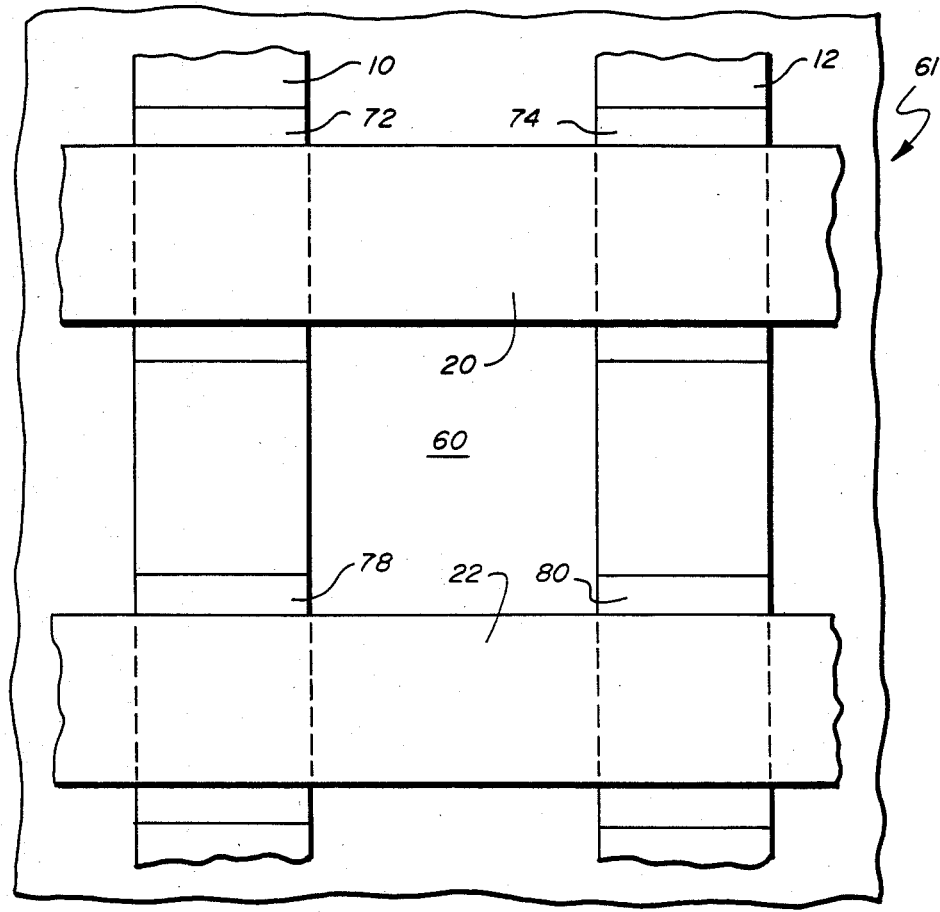
FIG. 4 is a planar top view of a portion of a substrate with a second set of applied address lines.

The manganese dioxide is for the purpose of plugging any potential pin holes that may be present in the tantalum oxide layer. After the manganese dioxide layer has been applied the excess material is removed from the substrate 60 as is well known in the art leaving a plurality of X address lines 10 through 14 on the substrate 60 with the manganese dioxide coated regions 72 through 82 over tantalum oxide of Y address lines such as 20, 22 is applied to the substrate 60 as shown in FIG. 4. The Y address lines such as 20 cross the X address lines such as 10 through 14 over the insulating regions 72, 74 and 76 which were previously formed. The Y address lines 20, 22 are deposited on to the substrate 60 using the same process as was used to deposit the X address lines 10 through 14.

If desired, once the excess material has been removed after applying the Y address lines an electrical test of the isolation between the X address lines 10 through 14 and the Y address lines 20 through 24 may be made. In the event that a given pair of lines such as 10, 20 are found to be not electrically isolated, perhaps due to pin holes in the tantalum oxide layer, a bias voltage not exceeding the anodizing voltage may be applied which causes the manganese dioxide to plug the pin holes hence restoring the integrity of the insulating layer between the address lines 10 and 20.

In the next step a layer of amorphous silicon alloy having either P or N type doping is applied to the entire substrate 60. Following the initial layer of amorphous silicon alloy a second, undoped, layer of amorphous silicon alloy is applied thereto. Finally, a third layer of amorphous silicon alloy doped with the opposite conductivity of the first layer is applied over the substrate 60. As a result, a continuous plurality of pin diodes is formed over the X and Y address lines as well as the remainder of the substrate 60. Preferably the amorphous silicon alloy further includes fluorine and hydrogen. The process of forming diodes from such materials is known in the art and was disclosed in U.S. Pat. No. 4,226,898 to Ovshinsky which is incorporated herein by reference.

Figure 5:
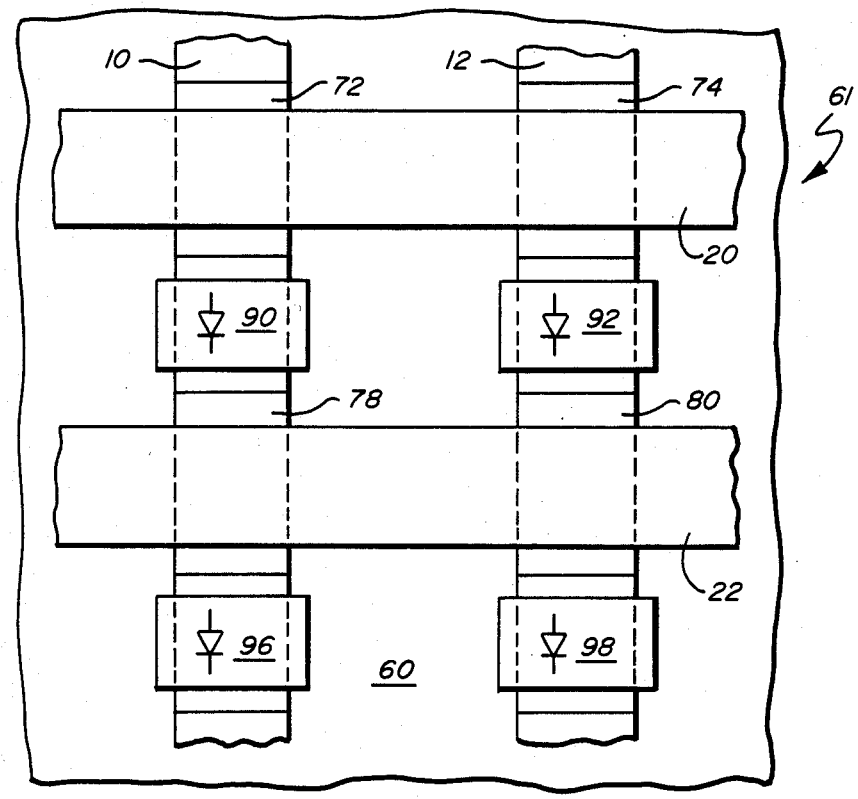
FIG. 5 is a planar top view of a portion of a substrate with a plurality of isolation elements formed theron.

The amorphous silicon film is then etched away so as to form a plurality of discrete diode regions 90 through 98 as shown in FIG. 5. Each of the diode regions 90 through 98 is formed upon and in electrical contact with a corresponding X address line 10 through 14. Each of the diode regions 90 through 98 is on the order of 8 microns long by 12 microns wide. Each of the diodes such as 90 is spaced 15 microns apart from the adjacent diodes such as 96. The diode members 90 through 98 correspond to the isolation members shown schematically in FIG. 1 as exemplary element 30. Preferably the amorphous silicon alloy will include hydrogen and fluorine as disclosed in Ovshinsky.

As an alternate to forming PIN type diodes 90 through 98, PN junction diodes can be formed on the substrate 60. Alternately, Schottky diodes, also disclosed in the '898 patent may be formed using a metallic layer deposited on a layer of selectively doped amorphous silicon. Schottky diodes have the advantage that the chalcogenide memory elements, such as 34-44 are in electrical contact with a metallic layer. If desired other isolation devices such as thin film filed effect transistors could be used without departing from the spirit and scope of the invention.

Figure 6:
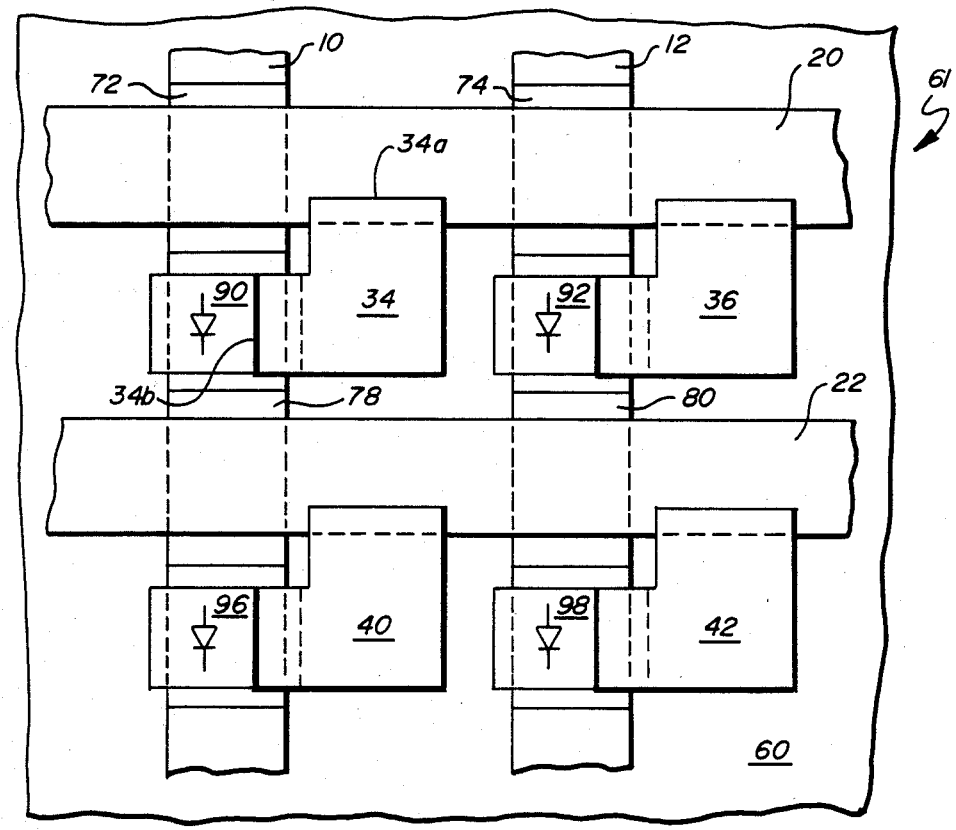
FIG. 6 is a planar top view of a portion of a substrate with a plurality of memory elements formed thereon.

In a final step as shown in FIG. 6, a plurality of phase changeable, settable memory elements 34 through 44 is formed on the structure on the substrate 60. The settable memory elements 34 through 44 are deposited as substantially planar thin films partly on the substrate 60. The steps of forming the memory elements 34 through 44 include applying a layer of photoresist to the structure on the substrate 60, exposing the photoresist with a mask such that the regions 34 through 44 are exposed to light, developing the photoresist, removing the exposed material, sputter depositing the phase changeable, settable material on the substrate 60 and then removing the excess by etching or any other method as is known in the art leaving only the regions 34-44.

As disclosed in U.S. Pat. No. 3,530,441 which issued on September 22, 1970 in the name of Stanford R. Ovshinsky, which is assigned to the assignee of the present invention and which is incorporated herein by reference, a phase changeable material is a material which can be altered between a substantially disordered and generally amorphous structure having local order and/or localized bonding for the atoms and a more ordered condition. The changes can be substantially within a short range order itself still involving a substantially disordered and generally amorphous condition, or can be from a short range order to a long range order which could provide a crystalline like or polycrystalline condition, all of these structural changes involving at least a change in local order and/or localized bonding. Changes in the local order and/or localized bonding which constitute structural change can be of a subtle nature and provide drastic changes in the material characteristics, such as electrical characteristics or optical characteristics readily usable in determining or detecting the structural changes.

Phase changeable materials of the type described above generally have a much lower conductivity when in their disordered phase than when in their more ordered phase. Such material can be either resettable or non-resettable. Non-resettable phase-change materials usually can be fairly easily programmed to change from their more disordered, low conductivity phase to their more ordered, higher conductivity phase, but they cannot easily be programmed to make the opposite transition. Resettable phase-change materials, on the other hand, can be changed back and forth between their more disordered and more ordered state by exposure to energy pulse of different length and intensity. Both types of phase-change material can be used with the present invention. Nonresettable materials are good for read only memories designed for the permanent storage of information. Resettable material are good for erasible memories. A resettable phase-changeable material which can be used with the present invention is the chalcogenide material having the formula $Ge_{20}Te_{80}$. Other suitable resettable phase-change materials are discussed in U.S. Pat. No. 3,530,441, issued to Stanford R. Ovshinsky on September 22, 1970, which is assigned to the assignee of the present invention and which is incorporated herein by reference.

A non-resettable phase-changeable material which can be used in the present invention is the chalcogenide material with a general formula: $Te_aS_bGe_cSb_d$. In a preferred material a represents 72 atomic percent of the material, "b" represents 2 atomic percent, "c" represents 24 atomic percent and "d" represents 2 atomic percent. The preferred settable memory material is sputter deposited onto the substrate with the substrate at an equilibrium temperature of 75° C. and at a pressure of $4.5 \times 10^{-3}$ Tor. The thickness of the settable memory or storage material deposited onto each of the regions 34 through 44 is on the order of 1,000 angstroms.

As shown in FIG. 6, each memory region such as the memory region 34, has a region 34a with a 10 micron length which overlaps an adjacent Y address line such as address line 20, a region 34b with a length of 8 microns which overlaps the adjacent isolation element such as isolation diode 90 with the other two full length sides of the memory region 34 being on the order of 12 microns long. The other storage elements have the same size and shape. Each of the memory or storage regions 34 through 44 is deposited asymmetrically with respect to the adjacent respective cross-over region, such as region 72, and asymmetrically with respect to each of the respective isolation diodes such as the diode 90. Each of the storage regions 34-44 is a substantially planar deposited thin film.

Finally the structure on the substrate 60 is passivated by applying an organic film such a transparent polyimide over the entire structure. The settable memory material on each of the regions 34 through 44 can then be photoprogrammed using a xenon lamp in combination with a mask.

It has been found that the resistivity of the material in the regions 34-44, when formed of $Te_{72}S_2Ge_{24}Sb_2$, is on the order of $10^9$ ohms per square prior to programming and in the order of $10^4$ ohms per square after exposure to a xenon lamp.

An important advantage of the memory matrix of FIG. 6 is realized when a memory element, such as 34, has been programmed and the chalcogenide material has been set to its low resistance state. When the polarity of the address lines 10, 20 is such that the isolation diode 90 conducts, the resistance between the address lines 10, 20 can be accurately designed, not by altering the thickness of the material 34, but by altering the geometry of the regions 34.

As is well known in the art, the resistance of an element, such as the element 34 is directly proportional to the length that the current flows through the element, the electrical path length, and inversely proportional to the thickness and width of the element. The resistance between the address line 20 and diode 90 can be increased or decreased by altering the geometry or shape of the region 34 so as to increase or decrease the length of the storage material through which the current flows.

Hence, a substantially greater resistance is present between the address lines 10, 20 when memory element 34 has been set to its high conductivity state and diode 90 conducts in the embodiment of matrix 5, on the order of $10^4$ ohms, than is the case where the thickness of the memory element determines the high conductivity resistance, on the order of 1 ohm. Similarly when the element 34 is in its low conductivity state, in the matrix 5, the resistance between address lines such as 10,20 tends to be on the order of $10^9$ ohms which is also greater than is the case where the thickness of the memory element determines the low conductivity resistance, on the order of $10^4$ ohms.

Figure 7:
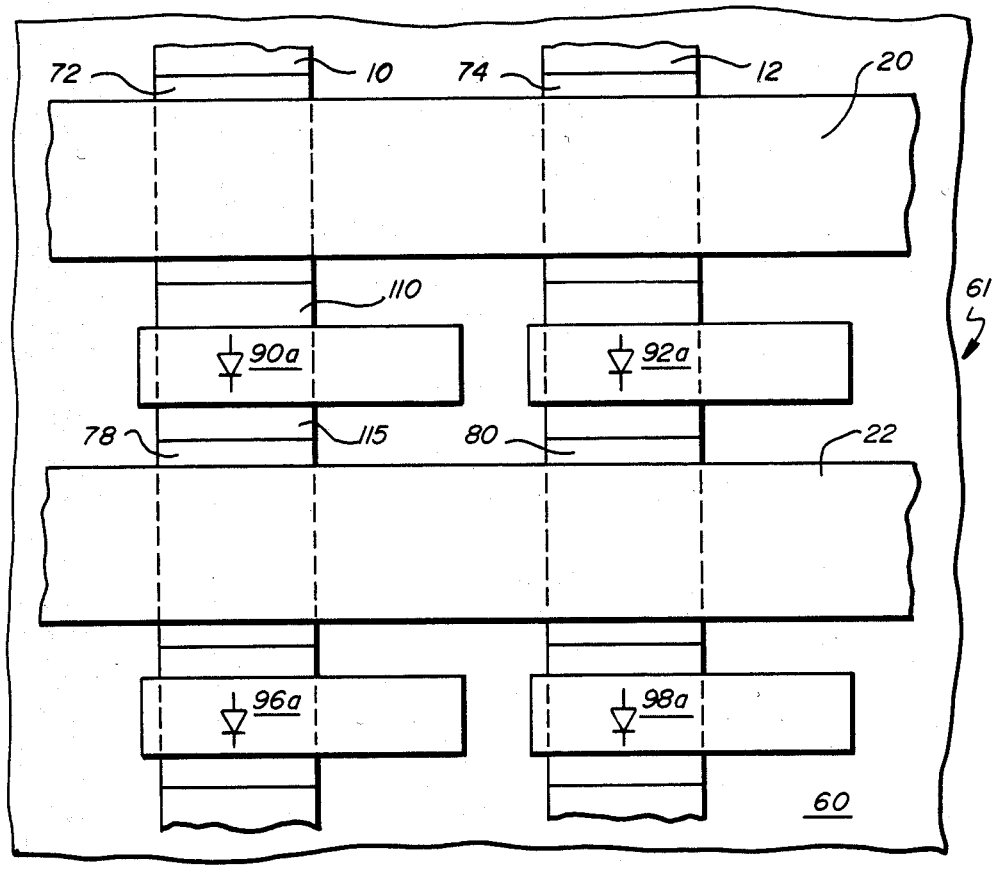
FIG. 7 is a planar top view of a second embodiment of a substrate with a plurality of rectangular isolation elements formed thereon.
Figure 8:
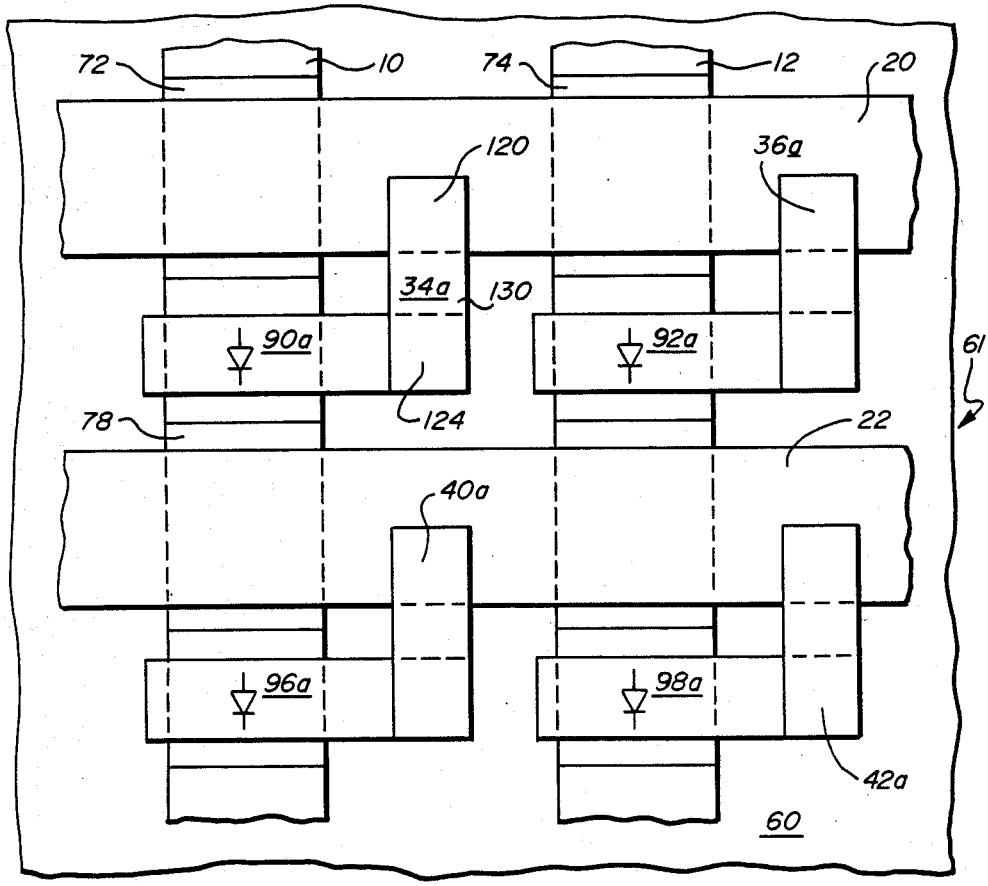
FIG. 8 is a planar top view of the second embodiment of a substrate with a plurality of rectangularly shaped memory elements formed thereon.

FIGS. 7, 8, disclose another embodiment of the invention. In FIG. 7 rectangular isolation diodes 90a through 98a are disclosed. The rectangular isolation elements 90a through 98a have dimensions on the order of 5 microns by 20 microns. The dimensions of diodes 90 through 98 were on the order of 8 microns by 12 microns. The embodiment of FIG. 7 thus provides a guard band 110, 115 or margin of 2½ microns on each side of the diode 90a between the oxidized pads 72, 78. The size of the diode 90 results in a 1 micron guard band on each side of that diode.

In FIG. 8, rectangularly shaped chalcogenide memory elements 34a, 36a, 40a and 42a are disclosed. The memory or storage elements, such as 34a, are each 5 microns wide and 15 microns long. The element 34a, has a 5 micron long region 120 overlapping the adjacent address line 20 and a 5 micron long region 124 overlapping the adjacent isolation member 90a. There is thus a 5 micron by 5 micron square 130 of storage material positioned between the isolation member 90a and the adjacent address line 20. The other storage elements 36a, 40a and 42a have the same overlapping structure.

The resistance of memory elements 34a, 36a, 40a and 42a will be on the order of $10^9$ ohms before programming and $10^4$ ohms after programming. As in the embodiment of FIG. 6, the high and low resistances of the memory cells 34a, 36a, and 40a, or 42a are on the order of 4 orders of magnitude greater than would be exhibited by the same size storage element where the thickness, 0.1 micron, is the length through which the current flows. The isolation elements 90a, 92a, 96a and 98a can be formed as Schottky barrier diodes, p-n diodes, p-i-n diodes or thin film filled effect transistors. The same steps disclosed with respect to forming the structures of FIGS. 5, 6 are used in forming the structures of FIGS. 7, 8.

Figure 9:
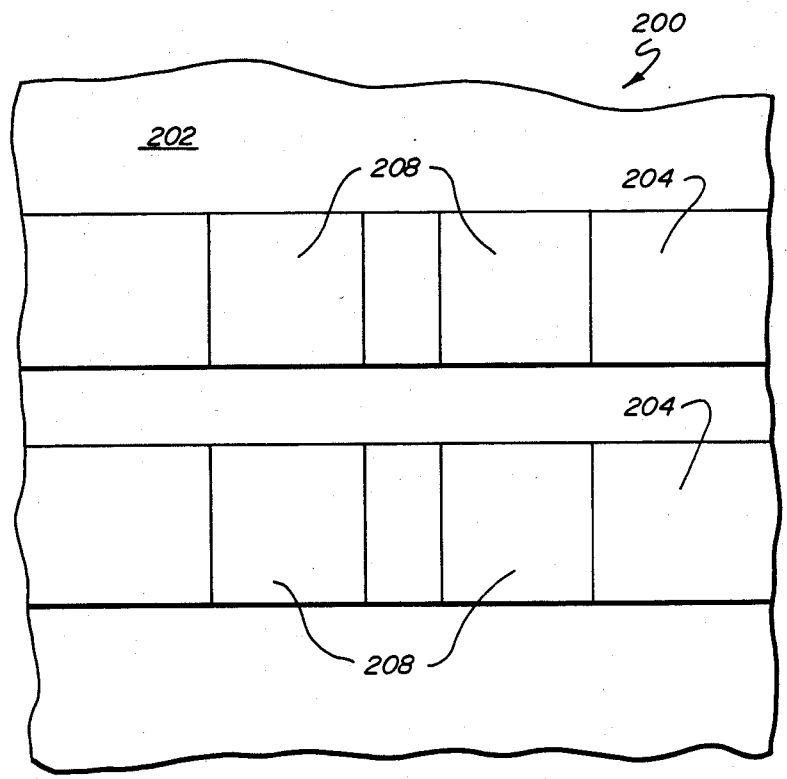
FIG. 9 is a planar top view showing two lines of a first, bottom, set of address lines, each with two thin film diodes formed on their surface, which diodes have been coated with a metal top layer.

Referring now to FIG. 9 through 12, another embodiment of the present invention is shown. In this embodiment of the invention a memory array 200 having a plurality of memory cells 201. The array is created by forming a plurality of bottom address lines, such as the Y address lines 204 shown in FIG. 9, upon the surface of a substrate 202 by photolithographic techniques. Once the bottom address lines 204 have been formed a plurality of regularly spaced isolation devices, such as the thin film p-i-n diodes 208 are formed on top of each of the bottom address lines 204. Preferably the diodes 208 are formed by depositing first a layer 210 of p-type material, followed by a layer 212 of i-type material, which, in turn, is followed by a layer 214 of n-type material. Once each of these three layers have been deposited across the entire surface of the substrate 202, a layer 216 of metal is deposited on top of the n-layer and is patterned by photolithographic techniques to have the shape of the p-i-n diodes which are to be formed beneath it. After this metal layer has been patterned, the entire surface of the substrate is submitted to an etch. This etch removes all of the p, i and n layers 210, 212 and 214 of amorphous semiconductor material, except for that deposited beneath the patterned metal, as is shown in FIG. 9.

Preferably the bottom address lines 204 and the top metal layers 216 are both formed of chromium, which makes a good ohmic contact with both p-type and n-type amorphous silicon alloys. The top metal layer 216 should be at least approximately 4,000 to 5,000 angstroms thick.

Once the diodes 208 have been formed with their top metal layers 216, the entire surface of the substrate 202 is coated with a layer 218 of an electrically insulating material, such as silicon dioxide or silicon nitride, between 5,000 and 10,000 angstroms thick.

Figure 10:
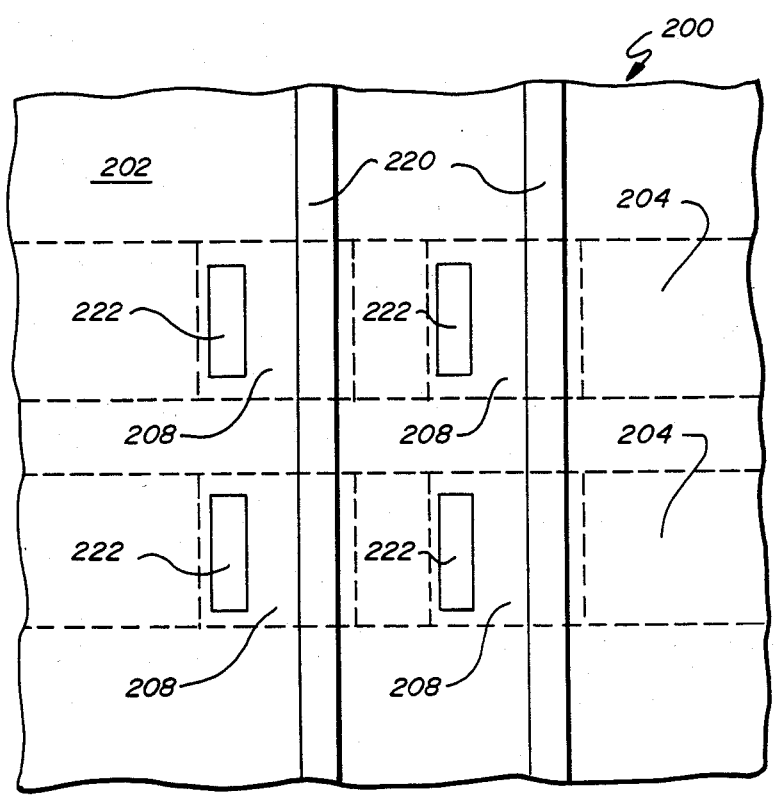
FIG. 10 is a planar top view of the substrate shown in FIG. 9 after its entire surface has been coated with an insulating layer, after top address lines have been deposited upon the insulating layer, and after vias has been formed through the insulating layer to the top metal layer on each of the diodes.
Figure 11:
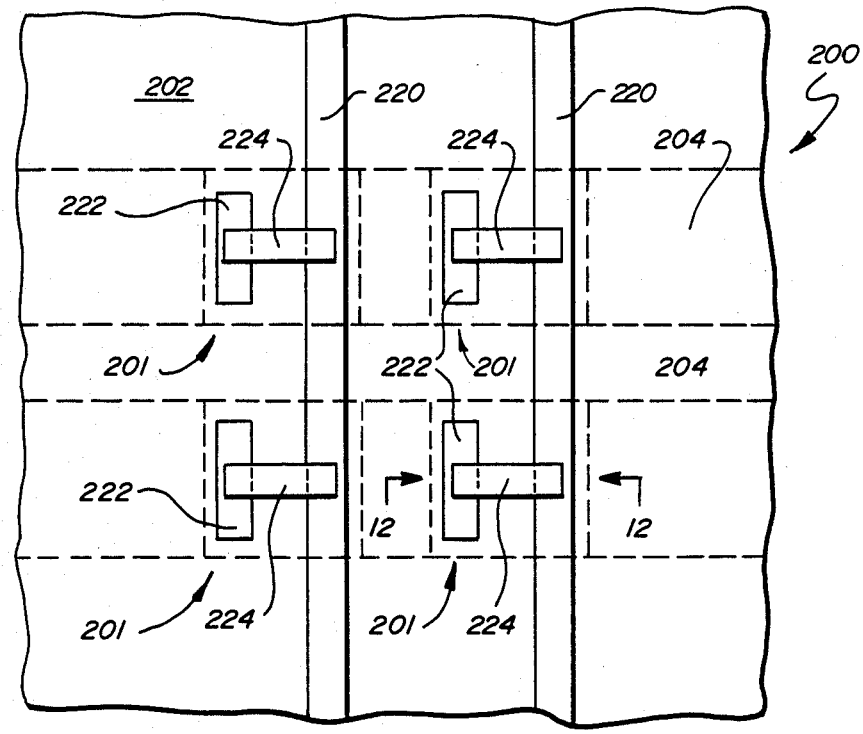
FIG. 11 is a planar top view of the substrate shown in FIG. 10, after a length of settable material has been formed between each diode and its corresponding address line.
Figure 12:
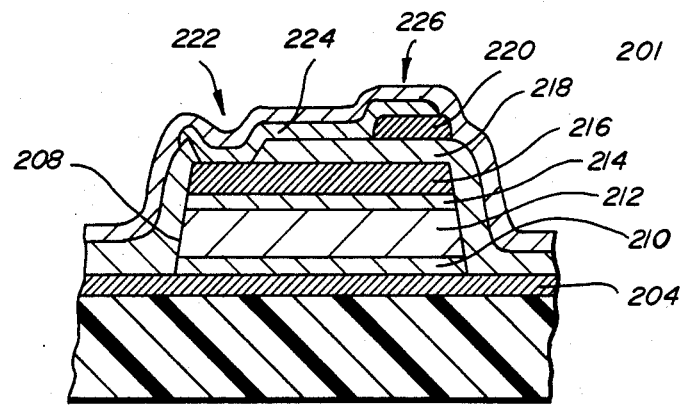
FIG. 12 is a cross-sectional side view of the portion of the substrate shown in FIG. 11 taken along the lines 12—12.

After the insulating layer 218 has been deposited, a set of top address lines 220 are formed upon its surface by photolithographic means. In the preferred embodiment, the bottom address lines 204 are each 30 microns wide and spaced apart by a 10 micron separation. The diodes 208 are approximately 30 microns by 30 microns square and are spaced apart along each line by 10 micron spacing. The top address lines 220, however, are substantially more narrow than the bottom address lines 204, being only 10 microns wide. As a result, the top address lines 220 can be position to extend over one end of each of the diodes 208, as is shown in FIGS. 10, 11 and 12. The advantage of this scheme is that it minimizes the amount of area required for each memory cell, while maximizing its diode area. The bottom lines 204 are made 30 microns wide because there is no saving in surface area by making them thinner than the diodes formed over them. The top address lines 220, however, are only 10 microns wide since making them wider would require additional surface area and since the conductivity of a 10 micron wide address line is sufficient for the purposes of the embodiment shown.

Once the metal lines 220 have been formed, a via 222 is etched through the oxide layer 218 to expose a portion of the metal layer 216 on top of each of the diodes 208. This via 222 is formed at the opposite end of each of the diodes from the end which is covered by the address line 220. After the via 222 has been etched, a layer of settable material of the type described above is deposited. This layer is then patterned by photolithographic means into a plurality of separate lengths 224 of the settable material, each extending from one of the vias 222 to its associated address line 220. The lengths 224 of settable material make electrical contact at one end to a top address line 220 and at the other to the metal layer 216 on top of its associated diode 208, through which it makes electrical contact to the diode 208 and its to its associated bottom address line 204. The length of settable material, or film, 224 is approximately 30 microns long and approximately 10 microns wide. Its placement directly above its associated bottom address line 204 and diode 208 results in a considerable saving of space as compared to the embodiments of the invention shown in FIG. 6 and 8, in which the length of settable material is horizontally separated from the bottom address line. The 4,000 to 5,000 angstrom thick metal layer 216 and the 5,000 to 10,000 angstrom thick insulating layer 218 formed over each diode 208 together are thick enough to insulate the diode form the programming energy required to change the settable material of the film 224 to its more conductive phase. This enables the settable film 224 to be programmed directly over the semiconductor material of the diode 208 without damaging the electrical properties of the diode.

After the layer 224 of settable film has been deposited, a passivating layer 226 formed of a transparent insulating material, such as polyimide or silicon dioxide is deposited across the entire surface of the substrate 202 to protect the settable film 224 from oxidation.

Figure 13:
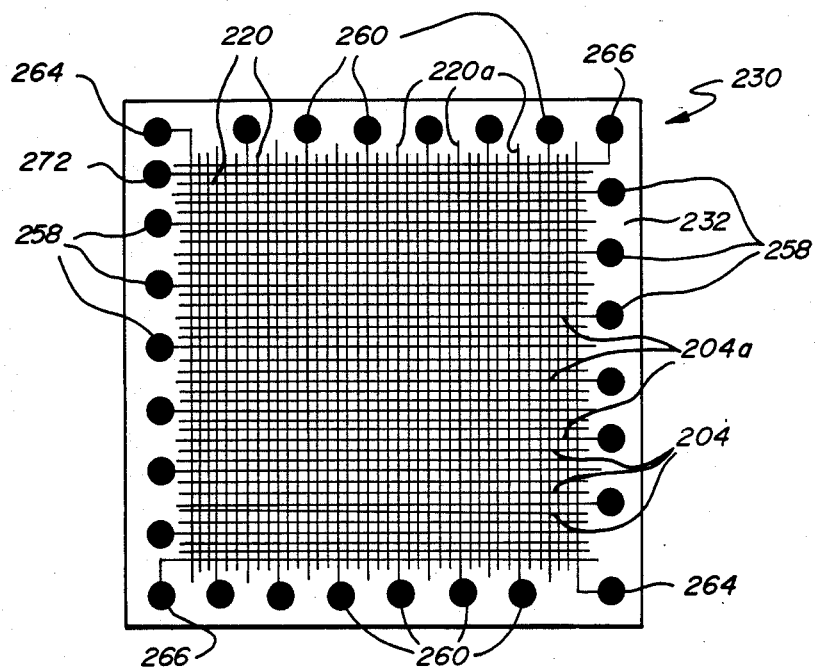
FIG. 13 is a representational top view of a memory array according to one embodiment of the invention.
Figure 14:
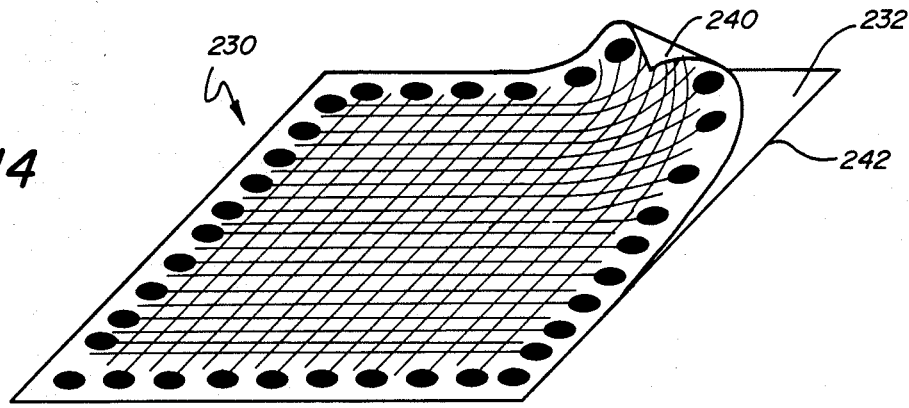
FIG. 14 is a representational perspective view of a memory array according to the present invention formed upon a flexible substrate.
Figure 15:
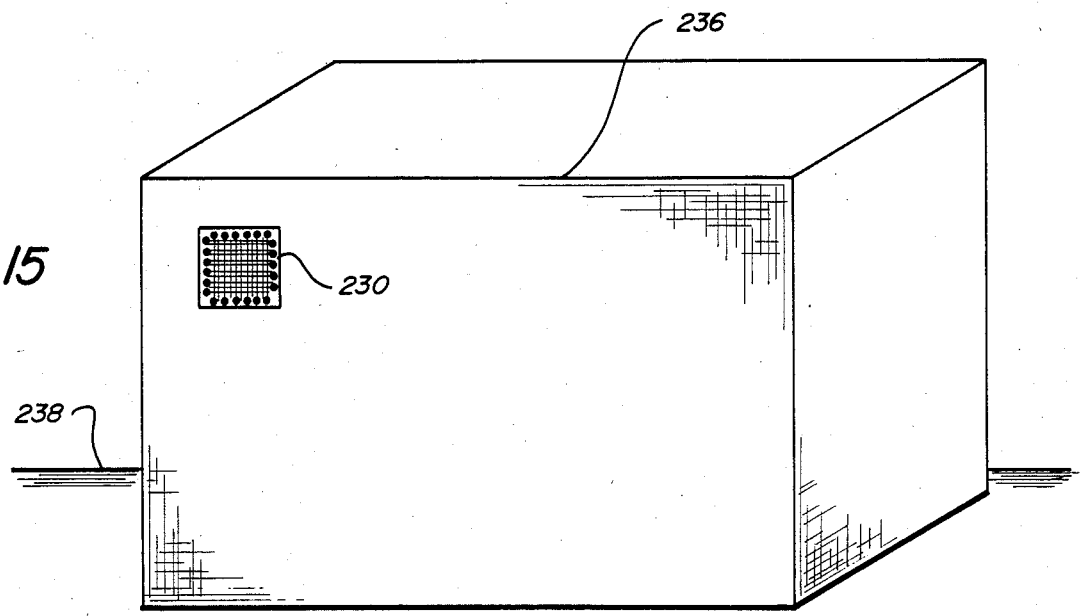
FIG. 15 shows a memory array according to the present invention attached to the surface of an object which it is used to label.

Referring now to FIGS. 13 through 15, a representational view is shown of an embodiment of the invention formed with a flexible substrate, such as one formed of a layer of synthetic polymeric resin. As is described above in the background of the invention, synthetic polymeric resins have become commercially available which can withstand sufficiently high temperatures to enable them to be used as electronic substrates. For example, the high temperature polyimide Kapton mentioned above in the background of the invention is capable of withstanding temperatures of up to 300° C. This is high enough to enable metal lines to be deposited upon Kapton. It is also high enough to enable amorphous semiconductor materials of the type used in the p-i-n diodes described above to be formed upon it. Thus the processes used to form the embodiments of the invention described above can also be used upon substrates of Kapton film, such as, for example, one of 5 mils. in thickness.

Since the deposited layers of thin film material used to make the circuitry of the present invention are themselves rather flexible, if they are formed upon a flexible substrate the resulting integrated circuit, including the address lines, rectifying elements, insulating layers, settable film, and passivation layer, as well as their substrate, is relatively flexible. Such circuits can withstand considerable bending without damage, and it will usually require sharp folds or creases in the substrate of such an integrated circuit to damage the circuitry formed upon them. A major advantage of such a flexible circuit is that it enables a relatively large area circuit to be made, which due to its flexibility, is not as brittle as an equivalently large area circuit formed upon a crystalline substrate. In addition, due to its flexibility, such an integrated circuit has the capacity to conform to many irregular surfaces, enabling it to be used as a label or a stamp upon envelopes, packages, crates and other objects. An example of this is shown in FIG. 15 in which the flexible integrated circuit 230 is used as a label attached to a package 236 shown upon a conveyor belt 238. As is shown in FIG. 14, the circuit 230 can be packaged with an adhesive material 240 attached to its back to enable it to be easily attached to the surface of an object which it is to label. To make the handling of such a circuit convenient, it can be manufactured with adhesive material 240 already applied and with a peelable back 242 which covers that adhesvive until the time that the label 230 is to be applied.

The label 230 can be optically programmed to contain information relating to the object such as the package 236 to which is attached. Such a description could, for example, contain information about the contents of the package to which it is attached, the destination of the package, or any other matters desired. The information can be optically written by means of a controllable laser which selectively focuses laser energy upon the length of settable film to be programmed. The information can also be mask programmed. This is done by placing a mask over the memory circuit 230 so as to register openings in the mask with portions of settable film which are to be programmed. Then the memory circuit is exposed to a bright light, such as a xenon flash, through the mask. Once information has been programmed onto the flexible circuit 230, that information can be read both optically and electrically. It can be read optically since many optically programmable settable films, such as the chalcogenide films described above, undergo a change in reflectivity when they undergo a phase change. The information programmed on circuit 230 is read electrically by using a device which makes electrical contact to the contact pads 234 located on the circuit 230, the device then applies a voltage to a selected combination of the contact pads 234, placing a desired potential between selected X and Y lines, and enabling the device to determine whether or not the settable film at the intersection between the selected X and Y lines has been programmed.

If the memory array 230 has relatively few memory elements, it is possible to have a contact pad 234 connected to each of its X and Y lines. However, if the number of memory elements in the array 230 is large, it becomes desirable to have decoding means on the integrated circuit which makes it possible to address each of its X - Y memory elements without the need for having a separate contact pad for each of its X and Y lines.

Figure 16:
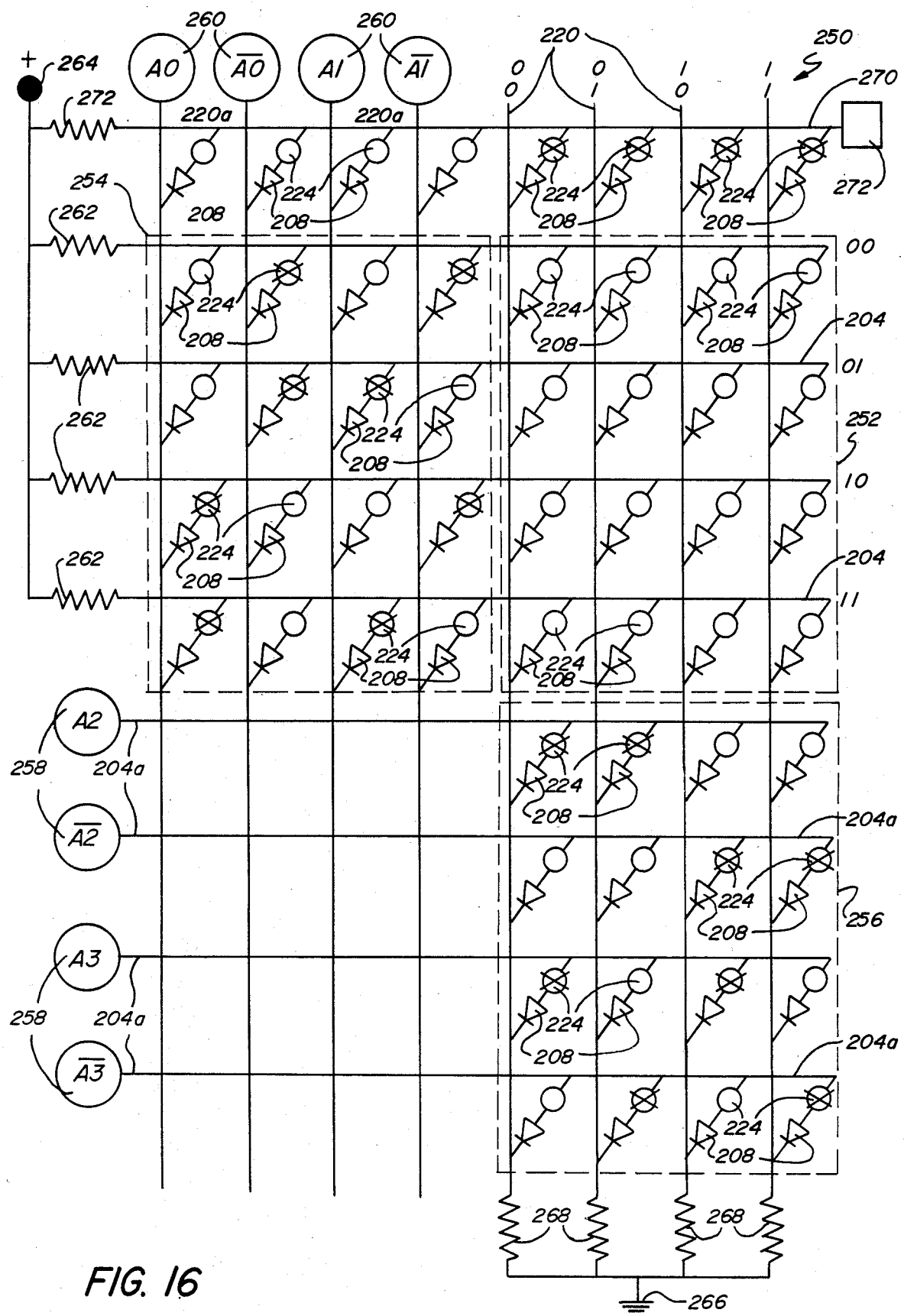
FIG. 16 is a schematic diagram showing how a memory array constructed according to the present invention can be formed with addressed decoding.

Referring now to FIG. 16, a schematic diagram is shown which illustrates the decoding circuitry used in certain embodiments of the present invention. The circuit 250 shown in FIG. 16 comprises an X - Y array formed of X lines 220 and Y lines 204, with a diode 208 electrically connected in series at intersections between X and Y lines. The array is divided into a standard memory portion 252, a Y line decoding portion 254 and an X line decoding portion 256. The standard memory portion 252 contains the settable memory means 224 for storing programmed information in series with the diodes 208 at each intersections between its X and Y lines. The X and Y decoding portions 256 and 254 do not function as standard memories, but rather function as decoding circuitry, causing a desired voltage to be applied across a selected X and Y line in the memory portion 252 when the address bits associated with the selected X and Y lines are applied to the X address inputs 258 and Y address inputs 260.

Each of the X lines 220a in the Y address decoding portion 254 is connected to one of the Y address inputs 260. Each bit of the address used to select a Y line and its inverse, or opposite, value is supplied as one of the Y address inputs 260. This is indicated in FIG. 16, in which both of the X and Y decoders have two bit addresses, A0 and A1 for the Y line decoder 254 and $\overline{A2}$ and $\overline{A3}$ for the X line decoder 256. As can be seen in the figure, each of these address bits and its inverse (indicated by a horizontal bar)is supplied to its associated decoder.

In the Y decoder 254, each of these address inputs is connected to an X line 220a which functions as a decoder input line. Each of these decoder input lines 220a forms an intersection with each of the Y lines 204 which address the programmable memory elements 224 in the standard memory portion 252 of the array. Each of these Y memory lines 204 is connected through a resistor 262 to a source 264 of a relatively high reference voltage. Each of the Y memory lines is connected through diodes 208 to certain ones of the decoder input lines 220a. The resulting circuit configuration causes each of the Y memory lines, its associated resistors 262, and its connections through diodes 208 to certain selected inputs 260 to constitute an AND gate. This is because each Y memory line 204 has its voltage pulled high through its pull-up resistor 262 unless one of the decoder input lines 220a to which it is connected has a low voltage, pulling the voltage of the Y memory line low. Each of the Y memory lines 204 is connected to a combination of address input bits and inverse-address input bits 260 which all have a high voltage if, and only if, the Y address associated with that memory line is supplied to the inputs 260. If any other address is supplied to the inputs 260, one of the lines to which the Y line is connected througn a diode 208 will have a low value, causing the value on that Y line to be pulled low. Thus, the Y decoding circuitry 254 causes the Y memory line associated with the address applied to its address inputs 260 to have a voltage which is pulled high and causes all the other Y memory lines to have a voltage which is pulled low.

The X address decoder operates in a manner substantially similar to that of the Y decoder portion, except that it uses negative logic. Each of he X address bits A2 and A3 along with their inverses, A2 and A3 is connected to a Y line 204a which forms an X decoder input line. Each of these decoder input lines forms an intersection with each of the X lines 220 used to address the memory portion 252 of the array. In the X decoder each of the X memory lines 220 is connected to ground 266 through a resistor 268. Thus the voltage of each X memory line 220 is pulled low through one of the resistors 268 unless it is connected through a diode 208 and an X decoder input line 204a to an X address input bit 258 which has a 734.1 positive voltage. The combination of each of the X lines 220, its connection through a resistor 268 to ground 266 and its connection through diodes 208 to selected of the X decoder input lines 204a constitutes a negative AND gate. This AND gate structure causes the value of an X memory line 220 to be pulled low only if all of the decoder input lines 204a to which it is connected have low voltage levels. Thus each of the X memory lines 220 used to address the standard memory portion 252 is connected to a particular combination of X address input bits 258 which causes its value to be low if, and only if, the address supplied to the inputs 258 is that associated with the particular X memory line.

As a result of the combination of the X and Y decoding circuitry described above, it is possible through supplying a Y address to the inputs 260 and an X address to the inputs 258 to make a selected Y memory line 204 have a high voltage and a selected X memory line 220 have a low voltage causing the memory element at the intersection of the selected X and Y lines to have a voltage applied across it. When such a voltage is applied across a selected memory cell, a determination is made whether or not the selected cell's settable film 224 has a high or a low resistance associated with a 0 or a 1, respectively. This determination is made by use of a Y line 270, which is connected through a resistor 272 to the positive voltage source 264. The line 270 is connected through a diode 208 to each of the X memory lines 220. The polarity of these diode connections is such that the voltage on the line 270 is pulled toward the lowest voltage of any of the X memory address lines 220. When a given X memory line 220 is selected to address a given memory cell, the X decoder 256 tends to pull its voltage to ground through a resistor 268. However, if the settable film 224 of the selected memory cell has a relatively low resistance, the voltage of that X line will not be pulled as low as it otherwise would be. This is because the high voltage of the selected Y memory line 204 is connected to the selected X memory line through the relatively low resistance path of the memory cell, tending to pull the voltage on the selected X line up somewhat. This causes the voltage on the line 270 and the contact pad 272 connected to the line 270 not to be pulled as low as it would if the settable film associated with the selected memory element had a high resistance. Thus the voltage on the contact pad 272 indicates whether a selected memory cell has been programmed or not.

One of the advantages of this decoding scheme is that it enables the X and Y decoders 254 and 256 to be made of the same materials and with the same processes as are used to make the memory portion 252 of the array 250. In very small arrays it is possible for the X and Y decoders 256 and 254 to be formed in an identical manner to that of the standard memory portion 252. In such an embodiment, like the one shwon in FIG. 16, the diodes 208 in the decoders are identical to those in the memory portion, and connection is made between Y and X address lines and their associated decoder input lines by means of selectably programming settable elements 224 of the same type as those used in the standard memory portion 252. This is indicated in FIG. 16, in which the settable elements 224 which have been programmed have an "X" written over them. However, for optimal performance it is preferred that the diodes used in the decoding portion be larger than the diodes used in the memory portion. This enables them to handle larger current flows and thus to more efficiently pull the voltage of the memory lines to which they are attached to a desired level. Also, in order to reduce resistive losses, it is preferred that the connection between the memory address lines and the decoder input lines in the decoder portions 256 and 254 be made by a mask programmed metal connections between the memory address lines 204 and 220 and the diodes 208, rather than by a programmed length of settable material.

The circuit diagram shown in FIG. 16, appears relatively inefficient, since the number of intersections of the array 250 devoted to storing bits is less than that devoted to performing the decoding function. However, the use of such decoding circuitry becomes much more efficient as the size of the memory array grows. For example, an array of 64×64 addressable memory elements can be addressed by a decoder having only 12 X decoding inputs 258 and 12 Y decoding inputs 260, and that includes X and Y address bits and their inverses. Such a decoding circuit enables 4,097 memory elements to be addressed with only 24 address contacts, rather than the 128 required without such decoding circuitry. As is indicated in FIG. 13, the decoder input lines 204a and 220a can be interspersed with the memory address lines 204 and 220, enabling the contacts 234 to be evenly spaced. The circuit 230 shown in FIG. 13 is read by supplying a pattern of addressing voltages to its 24 address input contacts 258 and 260 which corresponds to the address of a selected memory cell. In addition a ground voltage is supplied to the ground contact 266 and a positive voltage is supplied to the positive voltage contact 264. Then the logic value of the selected memory cell is read by measuring the voltage on contact 272.

In alternate embodiments of the invention transistors are used in the decoding circuitry. In such embodiments it is possible to make addressing circuitry which automatically sequentially addresses all of the bits of a memory circuit, enabling the entire circuit to be read with only a few external contacts.

Many modifications and variations of the present invention are possible in light of the above teachings. For example, many other type of isolation devices besides the diodes described above can be used to enable selective X - Y addressing of the invention's individual memory elements. Such other types of isolation devices include thin film field effect transistors, metal-insulator-metal threshold devices and back-to-back diodes, just to mention a few. In addition, the invention can be used in certain application without any isolation devices at all between its addressing means and its settable memory elements. Such embodiments are useful where it is desirable to make a selected two-way electrical connection between a given X line and a given Y line of an X - Y array. It is therefore to be understood that the invention can be practiced within the scope of the appended claims in ways other than those specifically described above.

We claim:

1. A method of forming a memory array comprising the steps of:
   providing a substrate;
   depositing a first set of spaced apart, substantially parallel address lines on said substrate;
   insulating a plurality of spaced cross-over regions on said first set of address lines;
   depositing a second set of spaced apart, substantially parallel address lines on said substrate at an angle to said first set of address lines so as to lie atop said insulated cross-over regions of said first set;
   depositing a plurality of spaced apart electrical isolation elements in electrical communication with a first one of said first and second sets of address lines, said isolation elements disposed between the cross-over regions thereof; and
   depositing a plurality of settable, substantially planar memory elements having a length dimension substantially greater than the thickness dimension thereof, said memory elements operatively disposed so as to establish series electrical communication through the length dimension thereof between a corresponding isolation element and the second one of said first and second sets of address lines; said memory elements made of a material capable of having the electrical conductivity thereof set from one conductivity state to another conductivity state by the application of programming energy.

2. The method of claim 1, including the further step of forming the settable memory elements from a chalcogenide material.

3. The method of claim 1, including the further step of forming the isolation elements from amorphous silicon alloy material.

4. The method of claim 1, including the further step of covering the array with a selected transparent material.

5. The method of claim 1, including the further step of photo-programming the array.

* * * * *